United States Patent [19]

Freadman et al.

[11] Patent Number: 4,884,655

[45] Date of Patent: Dec. 5, 1989

[54] TOWER-TYPE SPEAKER CABINET WITH PIVOTED PLURAL SPEAKER SUBASSEMBLY

[75] Inventors: Tommyca Freadman, Taipei, Taiwan; John F. Castagna, Milford, Pa.

[73] Assignee: Sparkomatic Corporation, Milford, Pa.

[21] Appl. No.: 260,410

[22] Filed: Oct. 3, 1988

[51] Int. Cl.[4] .............. H05K 5/00

[52] U.S. Cl. .............. 181/145; 181/147; 181/199; 181/207

[58] Field of Search .............. 181/144, 145, 147, 148, 181/199, 207, 143

[56] References Cited

U.S. PATENT DOCUMENTS

| | | | |
|---|---|---|---|
| 3,100,024 | 8/1963 | Leslie | 181/143 |
| 3,680,936 | 8/1972 | Backhaus | 181/145 X |
| 3,754,618 | 8/1973 | Sasaki | 181/145 |
| 4,014,597 | 3/1977 | Griffin, Jr. | 181/145 X |
| 4,054,750 | 10/1977 | Montgomery et al. | 181/141 X |
| 4,139,734 | 2/1979 | Fincham | 181/145 X |
| 4,624,337 | 11/1986 | Shavers | 181/145 |
| 4,730,693 | 3/1988 | Kobus | 181/145 |

*Primary Examiner*—B. R. Fuller

*Attorney, Agent, or Firm*—Mason, Fenwick & Lawrence

[57] ABSTRACT

A tower-type speaker cabinet assembly for plural speakers of a high fidelity audio system, including a vertically elongated tower cabinet having a pair of front wall segments adjacent the uppermost and lowermost ends of the tower speaker cabinet and an intermediate forwardly opening cavity extending between the upper and lower front wall segments, a pair of vertically spaced large subwoofer speakers in the respective upper and lower front wall segments with associated inner cabinets forming sound boxes therefor, and a swivelled movable center subcabinet spanning the vertical distance between said front wall segments, having a woofer, a mid-bass speaker and a pair of tweeters carried by a front wall portion of the center subcabinet in vertical alignment. The subcabinet has a range of swivel movement horizontally through predetermined angles about a vertical axis located a short distance rearwardly from the front wall of the swivelled subcabinet. Shock absorber strips are provided between the inner cabinets and the outer cabinet for minimizing vibration transfer therebetween.

14 Claims, 3 Drawing Sheets

FIG. 4
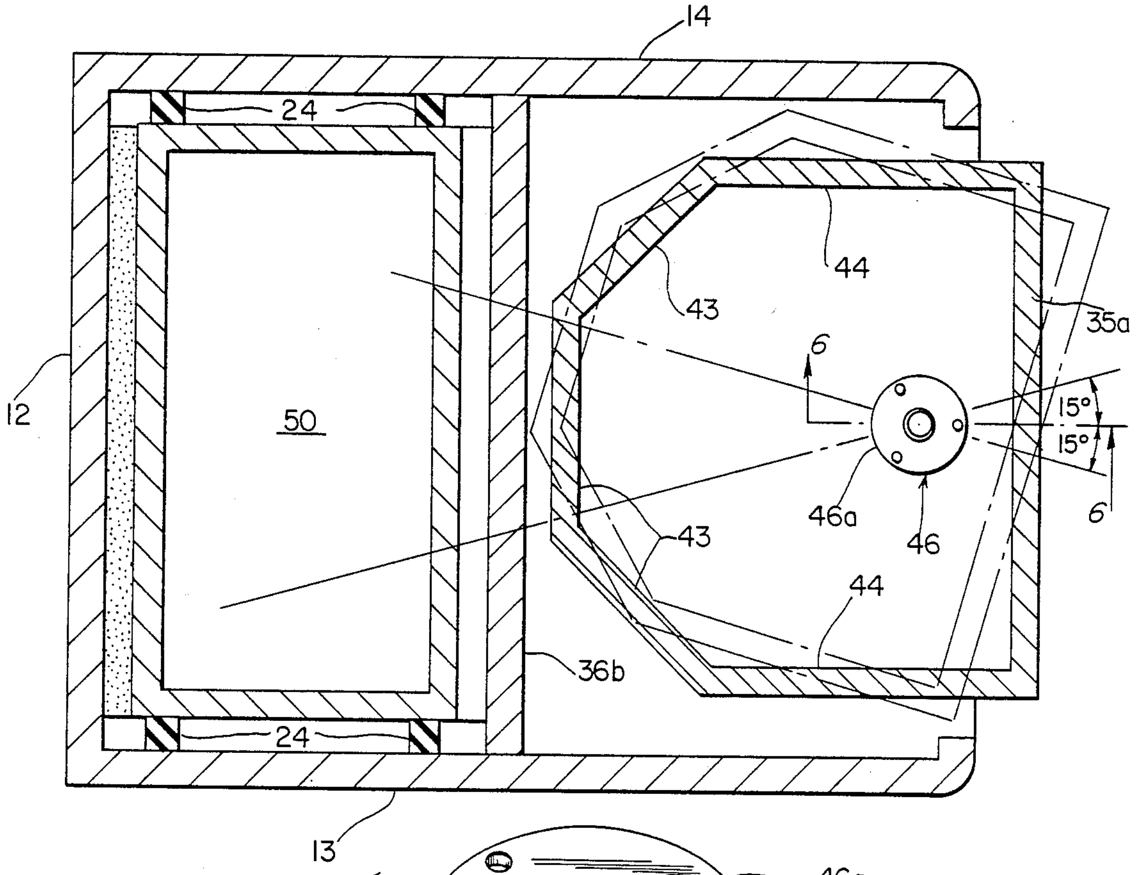
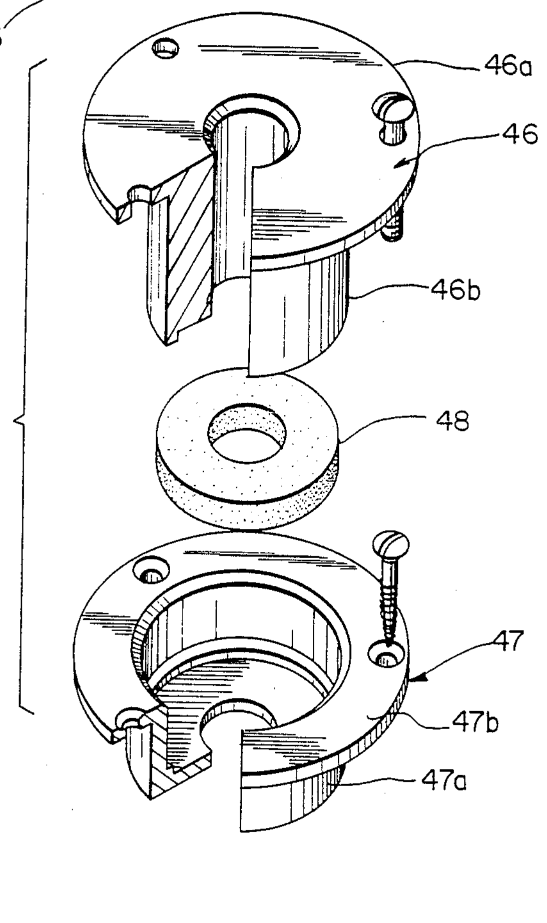
FIG. 5

TOWER-TYPE SPEAKER CABINET WITH PIVOTED PLURAL SPEAKER SUBASSEMBLY

BACKGROUND AND OBJECTS OF THE INVENTION

The present invention relates in general to loud speaker systems for high fidelity audio systems, and more particularly to tower-type assemblies for plural speakers high fidelity acoustical audio systems for music and other sound reproduction.

Heretofore, plural speaker units involving a woofer and one or more tweeters and/or mid-range and high range audio reproduction have been provided for high fidelity audio loud speaker systems, but such units customarily involved fixed speaker units and in most cases involved a single woofer for the low or base range and two tweeter and/or midrange units to cover the higher frequencies. More recently, tower-type plural speaker assemblies have been provided, and some cases employing up to five speakers, to more thoroughly cover the audio spectrum and obtain more faithful sound reproduction, but such units have still provided fixed support systems for the loud speakers in the tower cabinets and change of the direction of the predominant sound propagation from the speakers requires positioning of the heavy, large cabinet housing all of the speakers included in the tower-type cabinet and does not permit change of direction of a subgroup of the speakers relative to the cabinet and the rest of the speakers therein.

An object of the present invention is the provision of a novel tower-type loud speaker cabinet and plural speaker assembly wherein large subwoofer speakers are fixedly mounted by vibration-transfer-minimizing shock absorbing systems in upper and lower portions of the cabinet and the central portion of a cabinet including a plurality of midrange and tweeter type speakers is movably supported by a swivel system permitting a range of pivotal angular movement of the swiveled center cabinet subassembly for optimum imaging and dispersion. Thus the mid and high frequency drivers can be aimed from their own swivel mounted cabinet. Double cabinets are provided to eliminate troublesome resonant and each woofer is housed in its own cabinet, enclosed by another cabinet but acoustically isolated form it to minimize transmission of vibration to the outer cabinet. In the preferred embodiment, separate preamplifiers are provided for each of the speaker units.

Other objects, advantages and capabilities of the present invention will become apparent from the following detailed description, taken in conjunction with the accompanying drawings illustrating a preferred embodiment of the invention.

BRIEF DESCRIPTION OF THE FIGURES

FIG. 4 is a horizontal section view through a portion of the tower type speaker cabinet, taken along the line 4—4 of FIG. 3;

FIG. 5 is an exploded perspective view of the mounting swivel mechanism for the center cabinets subassembly.

DETAILED DESCRIPTION OF A PREFERRED EMBODIMENT

Figure 1:
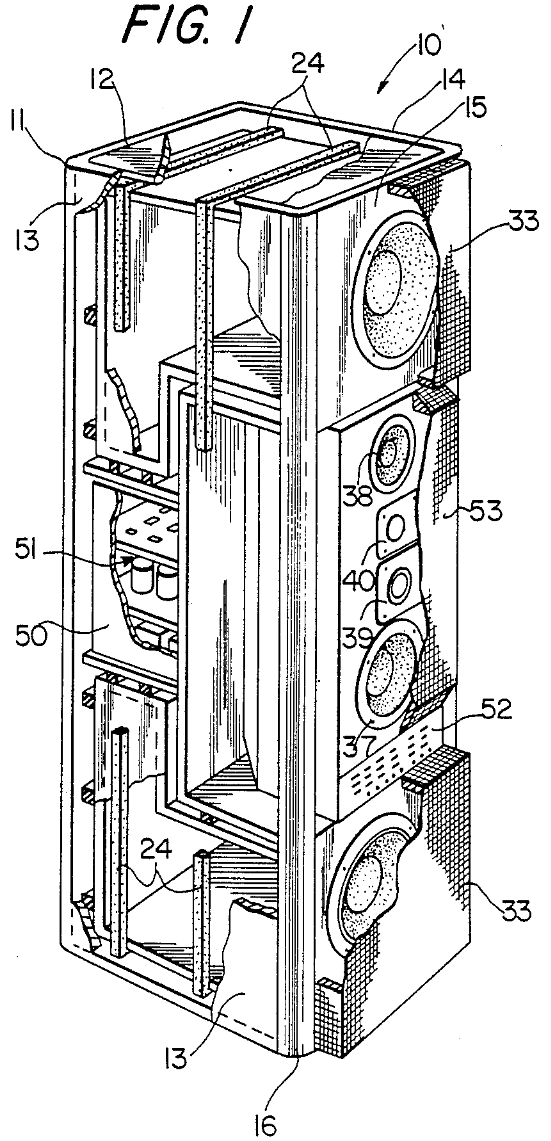
FIG. 1 is a perspective view, with parts broken away, of a tower-type speaker cabinet and plural audio speaker assembly embodying the present invention.

Referring to the drawings, wherein like reference characters designate corresponding parts throughout the several figures, the tower speaker assembly of the present invention is indicated generally by the reference character 10 and comprises a vertically elongated outer cabinet 11, which forms the main large cabinet of the tower speaker assembly, having a rear wall 12 and opposite left and right side walls 13, 14 which extend the full height of the tower, and upper and lower front wall segments 15, 16. Top wall 17 and bottom wall 18 lie in parallel horizontal planes, and together with the upper front wall segment 15 and lower front wall segment 16, and the adjacent side and end wall portions, form top and bottom cabinet housing portions for two subwoofer drivers or speakers, indicated at 19, 20, which in the illustrated embodiment are 10 inch extended long throw woven carbon fiber subwoofers. Each includes the usual speaker cone, indicated generally at *21a*, and an associated magnet and voice coil assembly, indicated at *21d*, to provide high rigidity and stability qualities.

Figure 3:
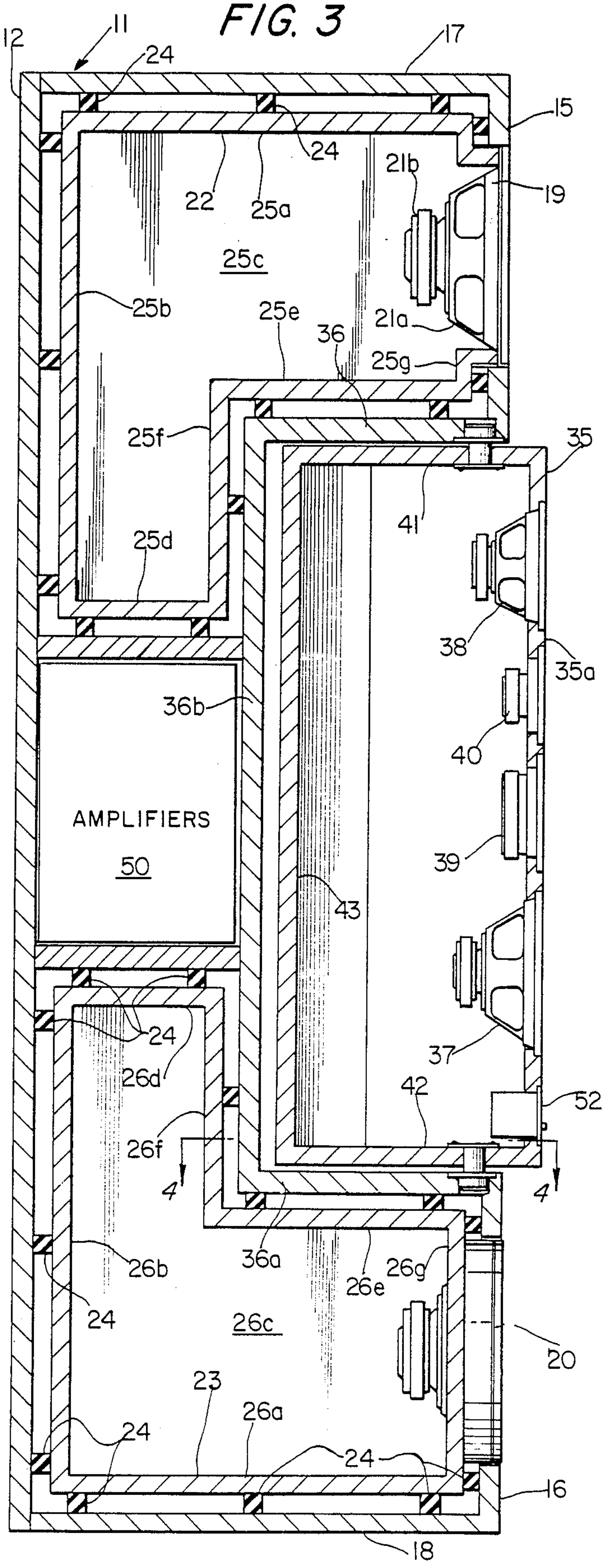
FIG. 3 is a vertical section view through the tower type speaker cabinet, taken along the line 3—3 of FIG. 2.

As best shown in FIGS. 1 and 3, the subwoofers 19 and 20 are mounted in separate housings, forming inner cabinets or speakers boxes, indicated at 22 and 23, which are of substantially L-shaped configuration in side elevation, forming an inner cabinet isolated from the outer cabinet 11 by foam rubber strips 24 acting a shock absorbers to prevent vibration transfer. The upper subwoofer box or inner cabinet includes a top wall *25a*, rear wall *25b*, side walls *25c*, and two bottom wall sections *25d* and *25e* connected by a transition vertical wall portion *25f*, providing an inverted L-shaped box configuration, completed by a front wall section *25g* having an opening *25h* therein receiving the speaker cone portion of the upper subwoofer 19. Similarly, the lower speaker box 23 for the subwoofer 20 includes a bottom wall *26a*, rear wall *26b*, side walls *26c*, top wall sections *26d* and *26e* connected by a vertical transition wall portion *26f*, defining the L-shaped lower subwoofer box 23, completed by the front wall *26g* having the opening *26h* therein for the lower subwoofer speaker cone 20.

Figure 6:
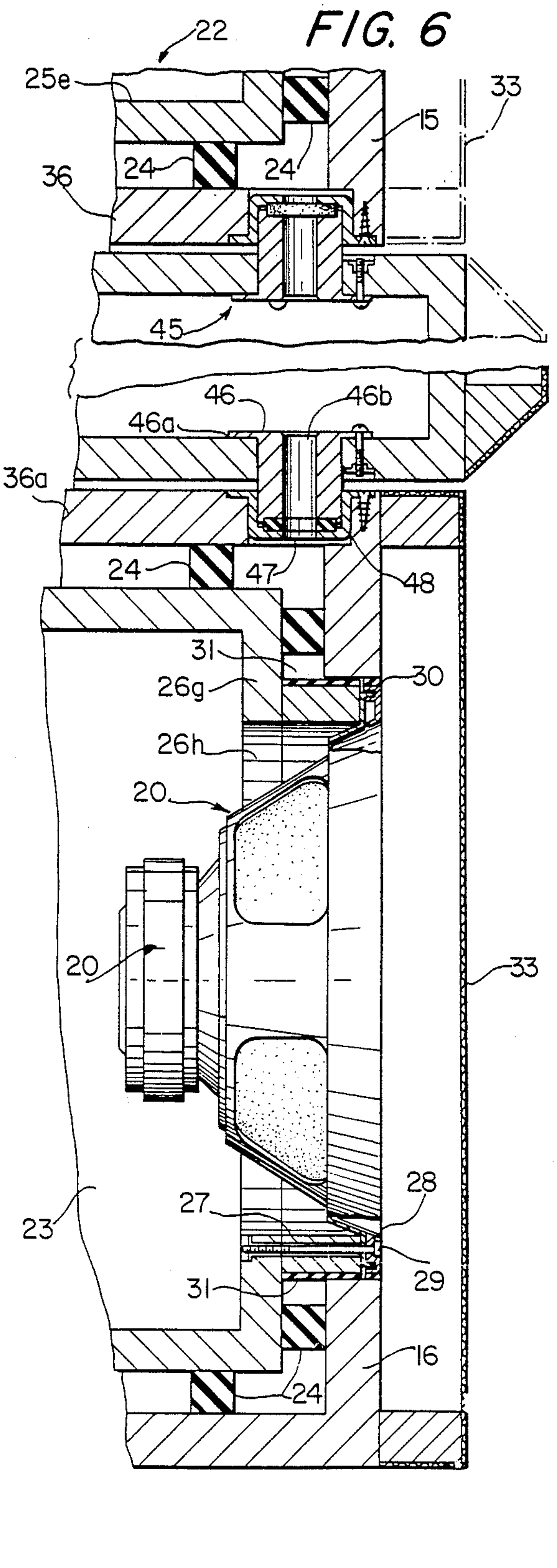
FIG. 6 is a fragmentary section view, to enlarge the scale, showing details of construction of the swivel mounting mechanism and the vibration dampening double cabinet construction of the woofer speakers, taken along the line 6—6 of FIG. 4.
Figure 2:
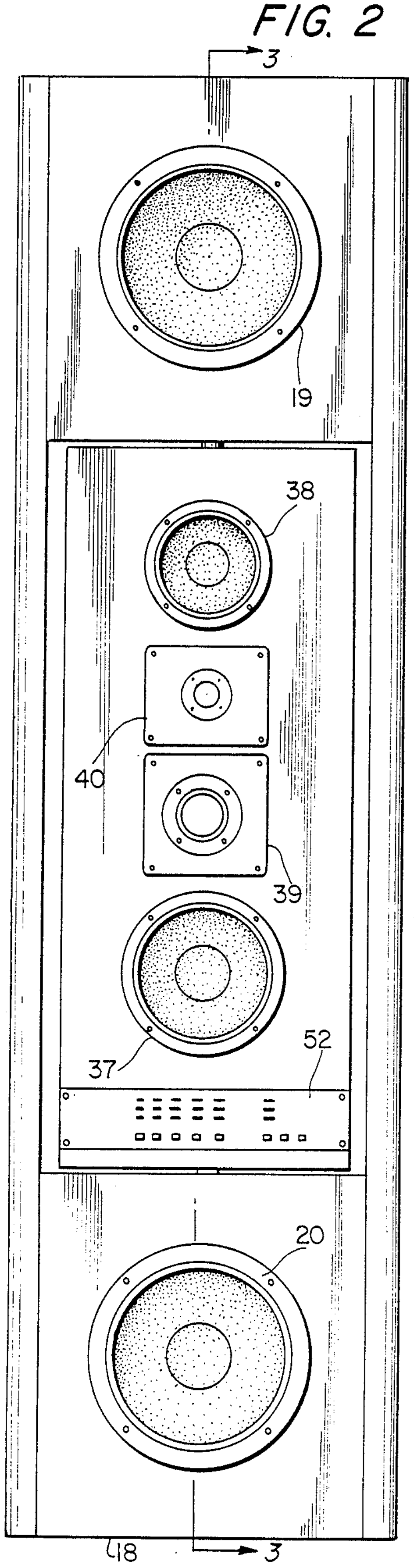
FIG. 2 is a front elevational view thereof, with the speaker cloth forwardly covering the individual speakers removed.

As shown in greater detail in FIG. 6 in the sectioned portion of the lower subwoofer 20 and its associated box 23, a wooden annular mounting collar formation 27 projects forwardly from the front wall *26g* in surrounding relation to the opening *26a*, and the rim portion of the speaker cone *21a* of the subwoofer 20 overlies the forwardmost end of the mounting collar formation 27 and is secured thereto by a ring 28 and bolts 29. A sponge gasket 30 is interposed between the metallic ring 29 and the surrounding wall portion 16 of the outer cabinet 11, and a rubber gasket 31 outwardly surrounds the wooden mounting collar formation 27 and extends between the latter and the confronting portion of the speaker-receiving opening in the outer cabinet front wall 16. These are provided to also act as shock absorbers to prevent vibration transfer. The upper subwoofer 19 is similarly mounted in the opening 25*h* of its associated inner cabinet or housing 22, and the front walls 15, 16 and subwoofers 19, 20 are both covered by speaker cloth covers 32, 33.

In the preferred embodiment, the main speaker cabinet forming the outer cabinet 11 is constructed of one inch thick high density particle board, provided with oil rubbed walnut veneer to provide an attractive surface. By mounting the subwoofers in separate housings, which are also made of one inch thick particle board, placed inside the main cabinet and isolated by mounting them on mechanical sponge rubber, cabinet resonance is virtually eliminated, as vibrations in the subwoofer housing transmit little energy through the rubber mounting to the main outer cabinet 11.

The center portion of the tower speaker cabinet structure between the upper and lower subwoofers 19, 20 and their associated housings, is arranged to provide a swivelled center cabinet section 35 received within a forwardly opening well defined by upper and lower horizontal partition sections 36, 36*a* and a rear wall portion 36*b*. The center cabinet 35 in the illustrated embodiment houses four speakers that range from upper bass to the tweeter range, including an 8 inch carbon fiber cone woofer 37, a 6 inch carbon fiber mid-bass 6½ inch coupler or speaker 38, a diamond-coated polyamide dome midrange speaker 39, for example, a 50 mm dome speaker, whose response is in the range 750 hz to 8 HKZ, and a diamond-coated polyamide tweeter 40, for example a 25 mm dome tweeter, having a response in the range 3.5 KHZ to 22 KHZ. These speakers are all mounted in appropriate openings in the front wall 35*a* of the center cabinet 35, with the midrange speakers mounted at a height for best listening in setting positions. The cabinet additionally includes top and bottom wall members 41, 42, rear wall section 43, and side wall sections 44, made for example high density fiber board.

Since the main cabinet 11 is physically large and heavy, the center cabinet 35 is made so as to be rotatable approximately plus or minus 15°, enabling the main cabinet to remain stationary while the center cabinet 35 is easily rotated for best "image" sound and sound stage focusing capability. Rotatable support assemblies are provided at the top and bottom wall portions 41 and 42 of the center cabinet 35, as best illustrated in FIG. 6, indicated generally by the reference character 45 and comprising a turning shaft 46 having a flange portion 46*a* fixed by screws to the adjacent portions of the center cabinet wall members 41 or 42 on which they are mounted, with the cylindrical body portion 46*b* of the turning shaft extending through and protruding beyond an opening therefor in the associated upper or lower center cabinet wall member. A companion generally cup-shaped bushing member 47 having a cylindrical well portion 47*a* is sized to receive a spacer 48 and a protruding end portion of the turning shaft 46 therein. The cup-shaped well portion 47*a* of the bushing 47 is recessed in a circular opening in the wall member 36 or 37 defining the upper or lower end of the well for the center cabinet 35 and a circular flange portion 47*b* of the bushing is similarly fixed by screws on the associated wall portion 36 or 37.

As will be seen in FIGS. 1 and 3, a center portion of the tower cabinet 11 located rearwardly of the well defined by the wall portions 36, 36*a* and 36*b* provides a space 50 for amplifiers 51 for each of the speakers, and amplifier controls are provided at a control panel 52 carried by the center cabinet 35 in the lower portion thereof for control and adjustment of the amplifiers. As illustrated in FIGS. 1 and 6, a speaker cloth covering 53 also covers the major portion of the front of the center cabinet 35*a* in forwardly covering relation to the speakers 37, 38, 39 and 40.

We claim:

1. A tower-type speaker cabinet assembly for plural speakers of a high fidelity audio system, comprising a vertically elongated tower cabinet of generally rectangular horizontal cross-section having vertical side and rear walls spanning a height thereof and upper and lower front wall segments adjacent uppermost and lowermost ends of the tower speaker cabinet spaced apart vertically and lying in a vertical plane, wall means defining an intermediate forwardly opening cavity extending between the upper and lower front wall segments, a pair of vertically spaced large subwoofer speakers in the respective upper and lower front wall segments having cone portions peripherally mounted to said front wall segments, a swivelled movable center subcabinet vertically spanning the space between said front wall segments, a plurality of vertically spaced speaker units including a mid-range speaker and tweeters carried by a front wall portion of said center subcabinet, pivot means supporting said subcabinet for a predetermined range of swivel movement horizontally through predetermined angles about a vertical axis located a short distance rearwardly from the front wall of said swivelled subcabinet locating the front wall at one angular position thereof in said vertical plane of said front wall segments of the tower cabinet, sound box structure for each of the subwoofers, and means for minimizing vibration transfer between the subwoofer sound box structure and said tower cabinet.

2. A tower-type speaker cabinet assembly as defined in claim 1, wherein said sound box structure comprises a pair of inner cabinets forming an upper sound box and a lower sound box respectively for said upper and lower subwoofers located behind the cone portion of the respective subwoofers and isolated from the walls of said tower cabinet by shock absorbers to prevent vibration transfer therebetween.

3. A tower-type speaker cabinet assembly as defined in claim 1, wherein rubber-like strips are interposed between walls defining said inner cabinets and said walls of said tower cabinet outwardly enclosing said inner cabinets forming said shock absorbers for preventing vibration transfer therebetween.

4. A tower-type speaker cabinet assembly as defined in claim 2, wherein rubber-like strips are interposed between walls defining said inner cabinets and said walls of said tower cabinet outwardly enclosing said inner cabinets forming said shock absorbers for preventing vibration transfer therebetween.

5. A tower-type speakers cabinet assembled as defined in claim 1, wherein said inner cabinets each include an annular collar formation surrounding an opening receiving the cone portion of the associated subwoofer forming a mounting ring against which a periphery of the subwoofer cone portion is attached, and a rubber gasket outwardly surrounds said mounting ring and is interposed between the mounting ring of each subwoofer inner cabinet and adjacent portions of the associated front wall segment to minimize vibration transfer therebetween.

6. A tower-type speakers cabinet asembled as defined in claim 2, wherein said inner cabinets each include an annular collar formation surrounding an opening receiving the cone portion of the associated subwoofer forming a mounting ring against which a periphery of the subwoofer cone portion is attached, and a rubber gasket outwardly surrounds said mounting ring and in interposed between the mounting ring of each subwoofer inner cabinet and adjacent portions of the associated front wall segment to minimize vibration transfer therebetween.

7. A tower-type speakers cabinet assembled as defined in claim 3, wherein said inner cabinets each include an annular collar formation surrounding an opening receiving the cone portion of the associated subwoofer forming a mounting ring against which a periphery of the subwoofer cone portion is attached, and a rubber gasket outwardly surrounds said mounting ring and in interposed between the mounting ring of each subwoofer inner cabinet and adjacent portions of the associated front wall segment to minimize vibration transfer therebetween.

8. A tower-type speakers cabinet assembled as defined in claim 4, wherein said inner cabinets each include an annular collar formation surrounding an opening receiving the cone portion of the associated subwoofer forming a mounting ring against which a periphery of the subwoofer cone portion is attached, and a rubber gasket outwardly surrounds said mounting ring and is interposed between the mounting ring of each subwoofer inner cabinet and adjacent portions of the associated front wall segment to minimize vibration transfer therebetween.

9. A tower-type speaker cabinet assembly as defined in claim 1, wherein said center subcabinet has a woofer and a midbass speaker and a mid-range dome tweeter and a high range dome tweeter forming the plural speaker units thereof arranged in vertical alignment along a vertical center axis of the front wall of the subcabinet and having a predominant sound propagation axis projecting perpendicularly from said front wall and movable laterally through a selected range from a predetermined center position.

10. A tower-type speaker cabinet assembly as defined in claim 2, wherein said center subcabinet has a woofer and a midbass speaker and a mid-range dome tweeter and a high range dome tweeter forming the plural speaker units thereof arranged in vertical alignment along a vertical center axis of the front wall of the subcabinet and having a predominant sound propagation axis projecting perpendicularly from said front wall and movable laterally through a selected range from a predetermined center position.

11. A tower-type speaker cabinet assembly as defined in claim 3, wherein said center subcabinet has a woofer and a midbass speaker and a mid-range dome tweeter and a high range dome tweeter forming the plural speaker units thereof arranged in vertical alignment along a vertical center axis of the front wall of the subcabinet and having a predominant sound propagation axis projecting perpendicularly from said front wall and movable laterally through a selected range from a predetermined center position.

12. A tower-type speaker cabinet assembly as defined in claim 4, wherein said center subcabinet has a woofer and a midbass speaker and a mid-range dome tweeter and a high range dome tweeter forming the plural speaker units thereof arranged in vertical alignment along a vertical center axis of the front wall of the subcabinet and having a predominant sound propagation axis projecting perpendicularly from said front wall and movable laterally through a selected range from a predetermined center position.

13. A tower-type speaker cabinet assembly as defined in claim 5, wherein said center subcabinet has a woofer and a mid-bass speaker and a mid-range dome tweeter and a high range dome tweeter forming the plural speaker units thereof arranged in vertical alignment along a vertical center axis of the front wall of the subcabinet and having a predominant sound propagation axis projecting perpendicularly from said front wall and movable laterally through a selected range from a predetermined center position.

14. A tower-type speaker cabinet assembly as defined in claim 6, wherein said center subcabinet has a woofer and a mid-bass speaker and a mid-range dome tweeter and a high range dome tweeter forming the plural speaker units thereof arranged in vertical alignment along a vertical center axis of the front wall of the subcabinet and having a predominant sound propagation axis projecting perpendicularly from said front wall and movable laterally through a selected range from a predetermined center position.

* * * * *